Figure 1:
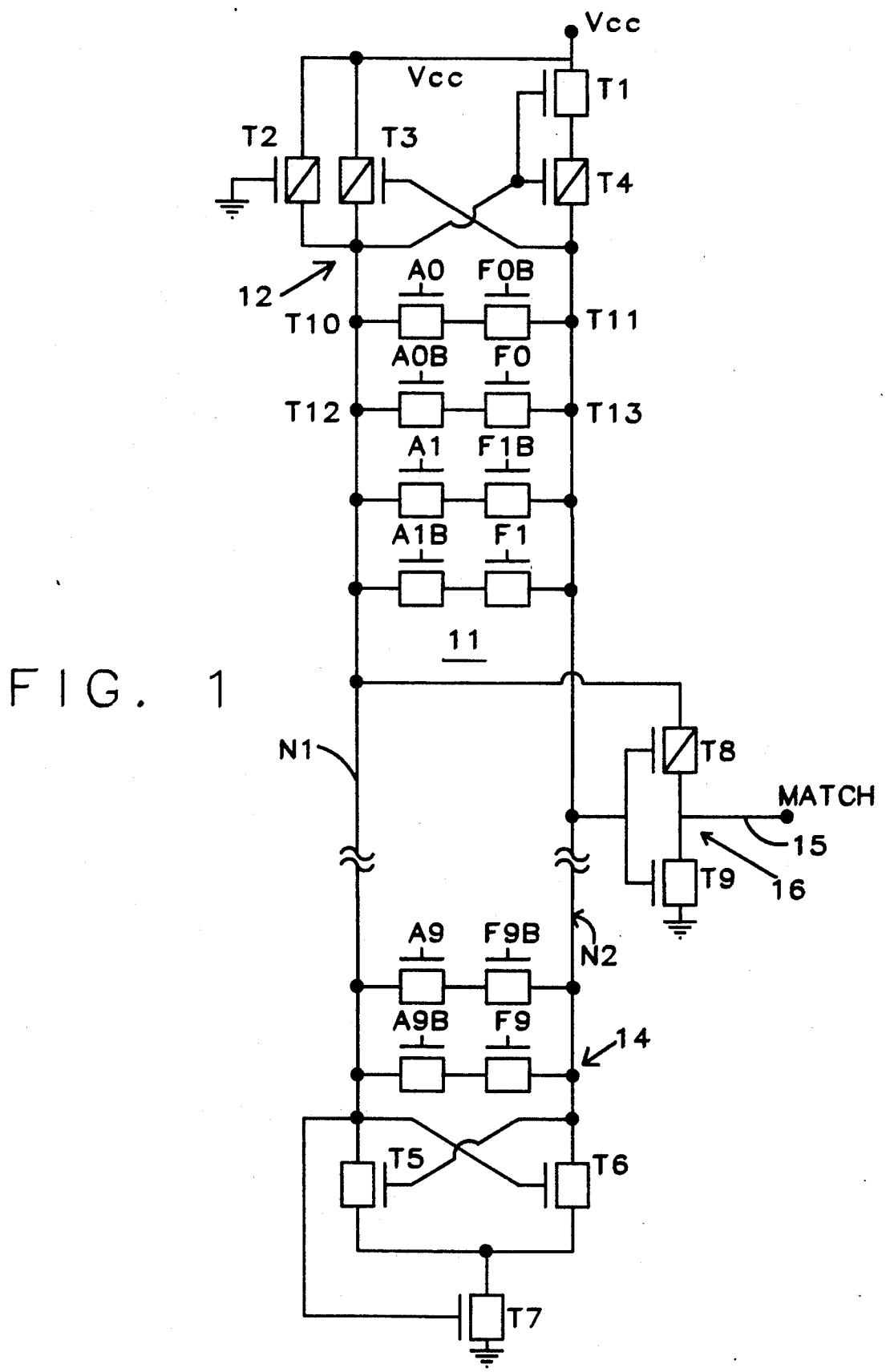

United States Patent
Mao

[11] Patent Number: 5,237,537
[45] Date of Patent: Aug. 17, 1993

[54] FAST COMPARE CIRCUIT PARTICULARLY FOR MEMORY WITH REDUNDANT ADDRESSING COMPONENTS

[75] Inventor: Robert S. Mao, Hsinchu, Taiwan

[73] Assignee: Etron Technology, Inc., Hsinchu, Taiwan

[21] Appl. No.: 713,506

[22] Filed: Jun. 12, 1991

[51] Int. Cl.⁵ .................... G11C 7/00; G11C 8/00
[52] U.S. Cl. ................... 365/230.06; 365/200; 365/189.07; 371/21.6
[58] Field of Search ......... 365/200, 230.06, 189.07; 371/21.1, 21.6, 40.1, 40.4, 11.5

[56] References Cited

U.S. PATENT DOCUMENTS

| | | | |
|---|---|---|---|
| 4,757,503 | 7/1988 | Hayes et al. | 371/21.1 |
| 4,922,134 | 5/1990 | Hoffman et al. | 365/230.06 |
| 5,058,070 | 10/1991 | Faber et al. | 365/200 |
| 5,073,891 | 12/1991 | Patel | 371/21.1 |
| 5,142,540 | 8/1992 | Glasser | 371/40.1 |

FOREIGN PATENT DOCUMENTS 0089996  7/1980  Japan .................. 371/21.1

Primary Examiner—William L. Sikes
Assistant Examiner—Toan Tran
Attorney, Agent, or Firm—George O. Saile

[57] ABSTRACT

A circuit for comparing two registers has a pair of circuit elements for each bit position and one or the other of these elements conducts if a mismatch occurs between the corresponding register positions. These circuit elements are connected between a first node and a second node. A first circuit pulls up the first node and a second circuit pulls down the second node, and when none of the circuit elements conduct, the first and second nodes have approximately the voltage of the power supply and ground voltage respectively. When any element conducts, the node voltages are approximately equal, at a value established by the voltage dividing effect of the two circuits. An output circuit responds to the voltage between the two nodes to produce a binary voltage signifying a match or mismatch. The first and second circuits are formed by latches that improve the speed of charging and discharging the capacitance of the two nodes when a match or mismatch condition occurs. The circuit is particularly intended for comparing a memory address register with a register that permanently holds an address of a defective component. When a match is detected, a redundant component is selected instead of the defective component.

14 Claims, 2 Drawing Sheets

FAST COMPARE CIRCUIT PARTICULARLY FOR MEMORY WITH REDUNDANT ADDRESSING COMPONENTS

ADDRESSING COMPONENTS

This invention relates to an address circuit for a static memory of a data processor. More specifically the invention relates to a circuit that compares the address supplied to the memory with a permanent address and produces a match signal for addressing an alternate memory word line.

INTRODUCTION

It will be helpful to review an example of a memory that uses an address matching circuit to select a redundant word line. The memory has binary storage cells located at the intersections of a matrix of word lines and bit lines. The cells along a word line form the bit positions of a memory word. When a selection voltage is applied to a particular word line, each cell along that line is enabled for a read or write operation. Consider for example a simple memory that has only sixteen words. Each of these sixteen lines is identified by one of sixteen addresses, 0000 to 1111 in binary and 0 to 15 in decimal. An address decoder circuit receives the four address bits and produces a selection signal on the corresponding one of the sixteen word lines.

Some memories have a second, redundant, set of word lines. If one of the normal word lines is found to be defective, the redundant line is used in its place. (Ordinarily this test for a defective word line is made only during manufacture.) For generality, the address of a defective line is put into permanent storage and on each memory access this address is compared with the address supplied to the memory (which will now be called simply the "memory address"). In the example of a memory with sixteen word lines, the permanent address also has four bits, and these bits form a register for the permanent address of the defective word line. Commonly, the permanent storage is in the form of fusible links that can be selectively opened while the word lines are begin tested. An address compare circuit receives the address in permanent storage and the memory address and compares the two bits at each bit position. If a match is found at each bit position, the compare circuit signals that the corresponding redundant word line is to be selected instead of the defective line.

A Bit Compare Circuit

Bit compare circuits are well known but it will be helpful here to introduce an example that will be used later. The address bits that are applied to the address decoder will be denoted by the letter "A" with the numeral for the bit position, and the bits for the permanent storage will similarly be denoted by the letter "F" (for fuse). For bit position 0, a compare circuit element forms the logical sum of products $(A0*F0)+(A0B*F0B)$; that is, A0 and F0 are both up or both down.

One of the two logical products (for example $A0*F0$) can be implemented by two FETs that are connected in series between the output of the bit compare circuit and the potential point that represents a binary 1 (positive in the examples in this specification). When both FETs in one element conduct, the potential point pulls up the output line to signify a logical 1. A simple compare circuit has two of these series circuits, one for each product in the logic function. One of these circuits will be called an "element of a compare circuit" or simply an "element."

Commonly, this compare circuit includes four additional FETs that implement the complement compare function, $(A0*F0B)+(A0B*F0)$, and these FETs pull down the output line when a mismatch occurs to signify a logical 0. One object of this invention is to avoid the need for both of these pairs of circuit elements.

The outputs of all of the match circuits are combined in a logic function to detect when a match has occurred at each bit position. The complement of this bit matching function is called the Exclusive Or function. Since many logic gates in the combining circuit have a complement function, an address compare circuit can be implemented with Exclusive Or circuits or with Not Exclusive Or circuits at the logic gate level.

An Address Matching Circuit of the Prior Art

One known implementation of this address compare circuit has a Not Exclusive Or circuit for each bit position, and And Invert circuit for each group of a few Not Exclusive Or circuits, and an Or Invert circuit that combines the outputs of all of the And Invert circuits. These successive logic stages slow the circuit, and a wider address can require additional stages. One object of this invention is to provide a compare circuit that requires only a few logic stages and in which the number of stages is largely independent of the width of the address.

A More General Description

As the background has been described so far, the memory has permanent storage for a single address and would be able to substitute for only one bad line. It will be understood that the memory can be given registers and associated circuits for several permanent addresses to operate a memory with more defects.

The memory address circuit in this example has been highly simplified. Memory addressing circuits can be complex, and a memory can have several levels of selection that each respond to a particular set of bits in the full address register. From a more general standpoint, the address bits in the permanent storage are associated with a level of addressing that has redundancy: when an address in permanent storage is matched, the memory accessing circuits will perform an operation to use the corresponding redundant component.

SUMMARY OF THE INVENTION

The bit position compare circuit used in this invention has two elements for each position with two series connected FETs in each element, as has been described. Both the true and complement values of the address bits are provided. The FET's of each element are connected to the two registers to both conduct when a mismatch occurs. All of the elements of the address compare circuit are connected to conduct between two nodes.

A circuit of two latches charged and discharges the capacitances of the two nodes. When a match occurs (no element is conducting), one node is discharged to approximately ground and the other node is charged to approximately the potential of the power supply terminal. During a mismatch, at least one element conducts and brings the two nodes to approximately the same potential. (The potentials differ by the voltage drop across the conducting FETs of an element.) Components in the two latches form a voltage divider that gives the two nodes approximately half the potential of the power supply terminal, a value that can be easily distinguished from the voltage of a match.

An output stage responds to the voltage difference of the two nodes and produces a signal that operates the redundant word line selection circuits when a match is found.

Other features of the invention will be apparent from the description of the preferred embodiment.

THE DRAWING

FIG. 1 is a schematic drawing of the address compare circuit of this invention.

Figure 2:
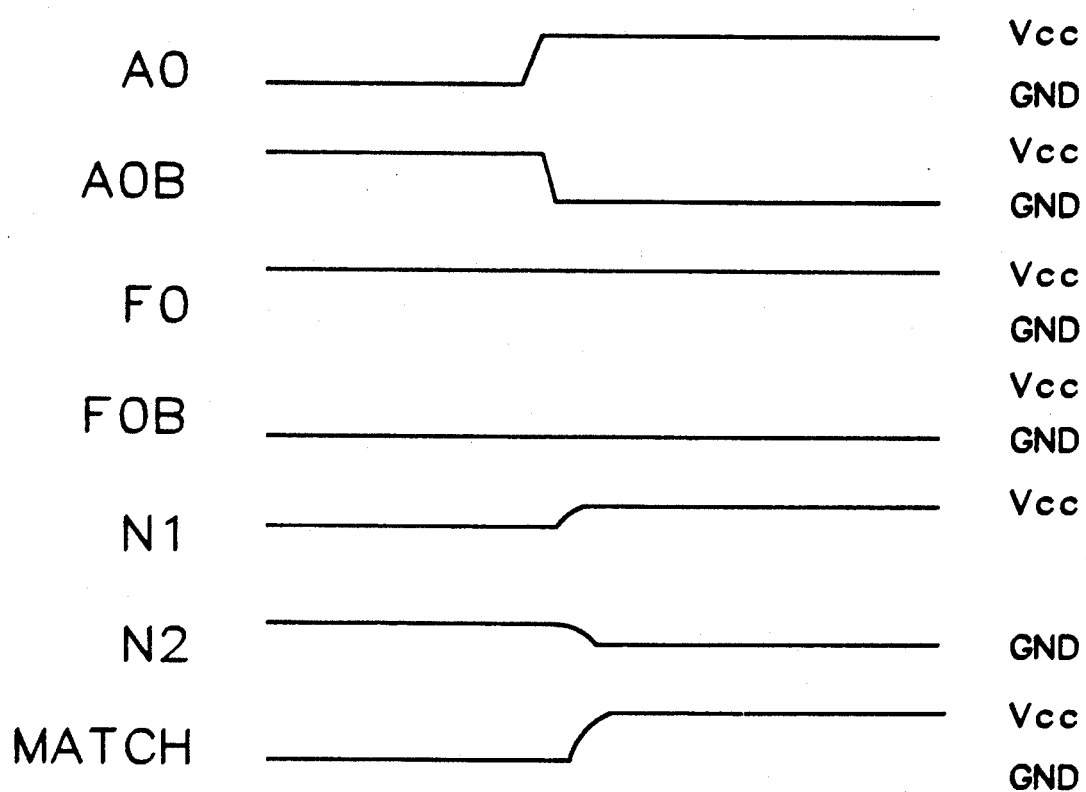

FIG. 2 has seven waveforms that illustrate the operation of the circuit of FIG. 1. The waveforms are identified by legends along the left column of FIG. 2.

THE PREFERRED EMBODIMENT

Introduction

As the drawing is organized, representative elements of an address compare circuit 11 are arranged in a column between two lines N1 and N2. A group of components at the top of the drawing will be called the upper latch 12 and a group of components at the bottom of the drawing will be called the lower latch 14. The inputs to the address compare circuit are the memory address bits A0 ... A9 and the corresponding permanent address bits F0 ... F9 and their complements, which are denoted by the suffix B. These inputs are shown connected to the gates of FETs in the compare circuits.

A line 15 carries the output, which is formed by a circuit 16 which is located to the right of lines N1 and N2. The circuit has a power supply terminal designated Vcc and a circuit ground. In the preferred circuit, Vcc is positive and it will be convenient to use this polarity in the description because it corresponds to the up and down signal levels that were introduced earlier.

The Bit Compare Circuits

A semiconductor chip that implements this circuit will ordinarily have elongated conductive lines on opposite sides of an array of FETs, in the general way that N1 and N2 and the compare elements are arranged in the drawing, but from a more general standpoint line N1 and N2 are simply nodes where the components connected to these lines receive the same potential.

The representative bit compare circuit for bit positions A0 and F0 has four FETs T10-T13. FETs T10 and T11 respond to the address bits A0 and F0B and both T10 and T11 conduct between nodes N1 and N2 when A0 is up and F0 is down. (Node N1 is always positive with respect to node N2, as will be explained later.) Similarly, FETs T12 and T13 receive address bits A0B and F0 and both conduct when bit A0 is down and bit F0 is up. Thus, if bits A0 and F0 do not match, one of the two elements will conduct between nodes N1 and N2.

The elements of the other bit positions are similarly connected to receive address bits and to conduct between nodes N1 and N2. If a mismatch occurs at any bit position, one element at that position of circuit 11 will conduct. Conduction of any element brings nodes N1 and N2 to approximately the same potential. (A threshold voltage exists across the conducting elements.) Thus the circuit produces a low voltage between nodes N1 and N2 in the case of a mismatch at any bit position and a high voltage in the case of a match at each bit position.

The same effect occurs if a mismatch occurs at more than one bit position.

Since the circuits that substitute a redundant word line for a defective word line respond only to the match condition at output 15, the mismatch condition also establishes a standby condition for the bit comparing circuit of FIG. 1 and for the circuits connected to its output.

The Output Circuit 16

Circuit 16 has two FETs T8 and T9 that are connected as a conventional CMOS inverter stage. (A slash in the schematic represents a p-channel FET and the absence of a slash represents an n-channel FET.) The source terminal of p-channel FET T8 is connected to node N1 and the gate terminals are connected to node N2. When a mismatch occurs and nodes N1 and N2 have about the same potential, the gate of T8 is made only slightly negative with respect to its source, and T8 turns off. The potential of node N2 at the gate of T9 turns on T9. Thus inverter stage 16 pulls down output line 15 to signal a mismatch.

When a match occurs (no element is conducting), nodes N1 and N2 have independent potentials and node N2 is low enough to turn off T9 and node N1 is high enough to turn on T8 and to raise output line 15 to a level to signal a match. (More specifically, the upper latch circuit 12 and lower latch circuit 14 give node N1 approximately the potential of power supply point Vcc and give node N2 approximately ground potential, as will be described later.)

The Upper Latch Circuit 12

FETs T3 and T4 have their drain and gate terminals cross connected to form a latch. The drain of T3 is connected to supply current to node N1 and the drain of T4 is similarly connected to supply current to node N2. A resistance formed by n-channel FET T1 is connected in the source circuit of T4; note that there is no corresponding resistance in the source circuit of T3. The voltage drop across this resistor causes node N2 to have a lower up level than node N1 when both FETs T3 and T4 would otherwise conduct approximately equally. T3 is larger than T4 (the width to length ratio of T3 is larger than the width to length ratio of T4), and T4 is not significant in the description of the charging and discharging circuits.

An FET T2 has its source terminal connected to Vcc and its gate terminal connected to ground so that it turns on when power is first supplied to the circuit, regardless of other initial conditions in the circuit. The drain terminal of T2 is connected to the drain terminal of T3 so that when T2 turns on it sets the circuit to the state that it would have if T3 were otherwise turned on when power is first applied. T2 is a small device, suitable to charge node N1 to its initial condition, but it does not conduct sufficiently to interfere with the operations of T3 to charge and discharge node N1 during the normal operation of the circuit.

The Lower Latch Circuit

In the lower latch circuit, FETs T5 and T6 have their gate and drain terminals cross connected to form a latch. The drain of T5 is connected to node N1 and the drain of T6 is connected to node N2. An FET T7 is connected to conduct between ground and the common connection point of the source terminals of T5 and T6.

The gate of T7 is connected to node N1 and it conducts according to the potential of N1. When a match occurs, T3 conducts to pull up node N1 and it thereby turns on T2 more fully. The added conduction of T7 helps to pull down node N2. FET T7 has the opposite effect when a mismatch occurs. When node N1 falls (in response to conduction through one or more of the compare circuit elements) T7 conducts less and it thereby assists in charging node N2 through T3 and the FETs of each conducting element.

Note that the drain terminal of each FET of each latch circuit 12, 14 is connected through one of the nodes to the gate terminal of one of the FETs of the other latch. For example, the drain terminal of FET T6 is connected to the gate of FET5, as already described, and it is also connected to the gate of FET3 in the upper latch.

The Waveforms of FIG. 2

The lines of FIG. 2 illustrate two memory access cycles, and the output on line 15, shown in the line Match, is down on the left, signifying a mismatch, and up on the right, signifying a match. Thus, the waveforms to the left in FIG. 2 show the state of the components when there has been a mismatch, and the waveforms to the right show the state of the components when there is a match.

Waveforms are shown for representative bit position 0. Assume that a match occurs in all other bit positions of the address during these two memory cycles. In this example, permanent bit 0 is a logical 1, as represented by the constant up level of bit position F0 and the constant down level of its complement, F0B. Thus in the circuit of FIG. 1, FET T11 is permanently on and will enable a mismatch signal if A0 is high and turns on T10. FET T13 is permanently off and thus prevents a mismatch signal when A0 is low and its complement A0B turns on FET T12.

In the first cycle line A0 is low, representing a 0 bit in address position 0, and in the second memory cycle of FIG. 2, line A0 is high, representing a 1 in address bit position 0. Thus bit A0 causes a mismatch in the first memory cycle. The complement address bit A0B may not be otherwise available in from address circuit, and the transition is shown as lagging the transition for A0, as would occur with an added inverter logic stage.

During a match (N1 and N2 are not connected through any element in the compare circuit), FET T2 in the upper latch circuit turns on, as described already, and thereby pulls up node N1. Note that the drain terminal of T2 is connected only to the gate terminals of the other FETs and that it conducts only as required to charge the capacitance at node N1 to approximately the voltage of power supply terminal Vcc. The other FETs similarly conduct only as required to charge or discharge the capacitance of nodes N1 and N2 and then stop conducting, as will be described.

The up level of node N1 turns on T6 and T7 in the lower latch, and in conduction of these FETs pulls down node N2 to approximately ground. These waveforms are shown in lines N1 and N2 in FIG. 2. The up level of node N1 also turns off T4. The down level of node N2 turns off T5 and turns on T3. Considered from a different standpoint, the capacitance of node N1 is charged to the voltage Vcc of the power supply and the capacitance of node N2 is discharged to ground.

When a mismatch occurs, the connection between nodes N1 and N2 discharges the capacitance of these nodes in the circuit of FETs T6 and T7.

Other Embodiments

Those skilled in the art will recognize various applications for this address compare circuit and modifications to adapt the preferred embodiment to variations in circuit technology, within the spirit of the invention and the intended scope of the claims.

I claim:

1. A circuit for comparing corresponding bit positions of a first register and a second register comprising,
    means providing true and complement values of the bit positions of the two registers,
    for each bit position, a first element (T10, T11) and a second element (T12, T13), each element having two FETs with their source and drain terminals connected to conduct in series circuit between a first node (N1) and a second node (N2) and having their gate terminals connected to receive said values of the bits of the registers for turning on both FETs of one element in response to a mismatch between the associated register positions,
    whereby the two nodes have approximately the same voltage when a mismatch occurs at any bit position and the voltages of the nodes are independent when a match occurs at each bit position,
    output circuit means (16) connected to respond to the difference in potential between the two nodes for producing an output voltage (line 15) signifying a match or mismatch,
    and a circuit (12, 14) connecting the two nodes between a power supply terminal (Vcc) and ground for charging the capacitance of the two nodes to a value to operate the output circuit in response to a match.

2. The comparing circuit of claim 1 wherein the charging circuit comprises
    a first FET (T3) and a second FET (T6) of opposite channel types,
    the first FET having its drain and source terminals connected to conduct between a power supply terminal (Vcc) and the first node and having its gate terminal connected to the second node to turn on according to the potential of the second node, and
    the second FET having it drain and source terminals connected to conduct between the second node and ground and having its gate terminal connected to the first node to turn on according to the potential of the first node.

3. The comparing circuit of claim 2 wherein the output circuit comprises
    a CMOS inverter stage (16) having a third FET (T8) of the same channel type as the first FET (T3) and a fourth FET (T9) of the same channel type as the second FET (T6),
    the third FET having its source connected to the power supply terminal through said first FET and the fourth FET having its source terminal connected to ground,
    the common connection of the drain terminals of the third and fourth FETs forming the comparing circuit output and the common connection of the gate terminals being connected to the second node, to switch the inverter stage in response to the voltage of the second node.

4. The comparing circuit of claim 3 wherein the source terminal of the third FET (T8) is connected to the first node.

5. The comparing circuit of claim 4 wherein the capacitance charging circuit (12, 14) comprises
a fifth FET (T7) of the same channel type as the second FET (T6) having its drain and source terminals connected to conduct between ground and the source terminal of the second FET and having its gate connected to the gate terminal of the second FET, whereby the second and fifth FETs conduct together in response to the potential at the first node,
the first (T3), second (T6) and fifth FETs being comparable in size whereby during a mismatch they form a voltage divider giving the first node and the second node voltages approximately half of the power supply point.

6. The comparing circuit of claim 5 wherein the capacitance charging circuit (12, 14) includes a sixth FET (T5) connected in a latch configuration with the second FET (T6).

7. The comparing circuit of claim 6 wherein the sixth FET (T5) may conduct during a mismatch when the voltages at the first and second nodes are approximately equal, and the sixth FET is smaller than the second FET (T6) to avoid interfering with the conduction of the second FET.

8. The comparing circuit of claim 7 wherein the sixth FET (T5) has its gate connected to the second node, its drain connected to the first node, and its source connected to the common connection point of the source of the second FET (T6) and the drain of the fifth FET (T7).

9. The comparing circuit of claim 8 wherein the capacitance charging circuit (12, 14) comprises a seventh FET (T4) of the same type as the first FET (T3) connected in a latch configuration with the first FET, the seventh FET being sufficiently smaller than the first FET to not interfere with the effect on the circuit of the conduction of the first FET.

10. The comparing circuit of claim 9 wherein the seventh FET (T4) has its gate terminal connected to the first node, its drain terminal connected to the second node, and wherein the capacitance charging circuit includes a voltage dropping device (T1) connecting the source of the seventh FET to the power supply terminal,
whereby the second node can not rise closer to the power supply terminal than the first node.

11. The comparing circuit of claim 10 wherein the first FET (T3) is larger than the seventh FET (T4) to prevent the seventh FET from interfering with the effect on the circuit of the conduction of the first FET.

12. The comparing circuit of claim 11 including means connected between the first node and the power supply terminal for charging the first node to an initial state when power is first applied to the circuit.

13. The comparing circuit of claim 12 wherein the means for charging the first node to an initial state comprises an eight FET (T2) of the same type as the first FET (T3) having its source connected to the power supply terminal, its gate connected to ground, and its drain connected to the first node (N1), the eighth FET begin sufficiently smaller than the first FET (T3) to prevent interference with the switching operations of the first FET.

14. The comparing circuit of claim 13 wherein the first register holds a memory address for a word line and the second register holds an address of a defective word line.

* * * * *